United States Patent [19]
Bellavance

[11] 4,097,819
[45] Jun. 27, 1978

[54] SEMICONDUCTOR LASER

[75] Inventor: David W. Bellavance, Dallas, Tex.

[73] Assignee: Texas Instruments Incorporated, Dallas, Tex.

[21] Appl. No.: 771,866

[22] Filed: Feb. 25, 1977

Related U.S. Application Data

[62] Division of Ser. No. 645,773, Dec. 31, 1975, abandoned.

[51] Int. Cl.² .............................................. H01S 3/19
[52] U.S. Cl. .............................. 331/94.5 H; 357/18; 357/56
[58] Field of Search ................... 331/94.5 H; 357/16, 357/17, 18, 55, 60, 56

[56] References Cited
U.S. PATENT DOCUMENTS 3,883,219  5/1975  Logan et al. ............ 331/94.5 H
3,902,133  8/1975  Watts ..................... 331/94.5 H
4,007,978  2/1977  Holton .................... 331/94.5 H

OTHER PUBLICATIONS

I. Hayashi et al., "GaAs–$Al_xGa_{1-x}$As Double Heterostructure Injection Lasers" Journal of Applied Physics, vol. 12, No. 5, Apr. 1971, pp. 1929–1941.

*Primary Examiner*—Stanley D. Miller, Jr.
*Assistant Examiner*—James W. Davie
*Attorney, Agent, or Firm*—James T. Comfort; Rene' E. Grossman; Stephen B. Goldman

[57] ABSTRACT

A semiconductor laser has a semiconductor base having (100) orientation. A semiconductor mesa of a III-V material is grown on the base by liquid phase epitaxy. The semiconductor mesa has crystallographic facets perpendicular to the base and parallel to one another. The crystallographic facets from the reflecting mirrors of a lasing cavity.

8 Claims, 5 Drawing Figures

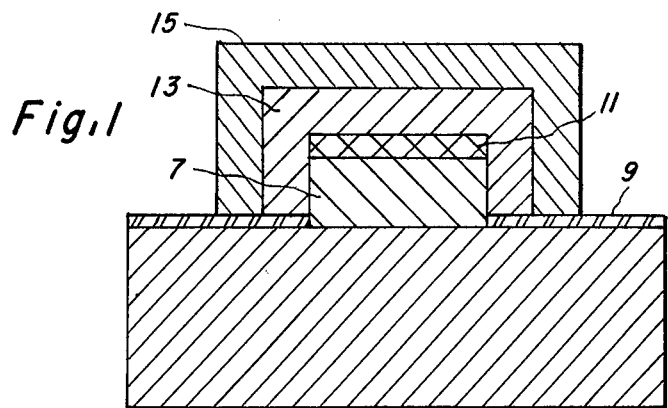
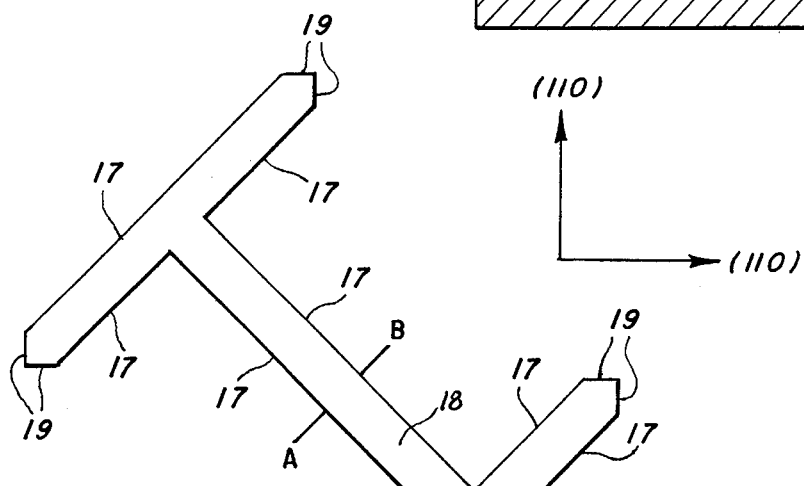
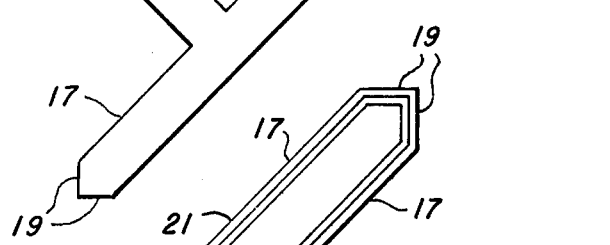
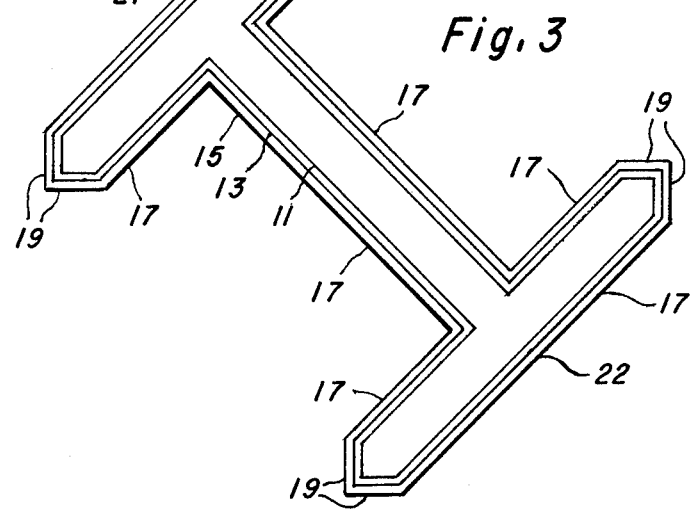

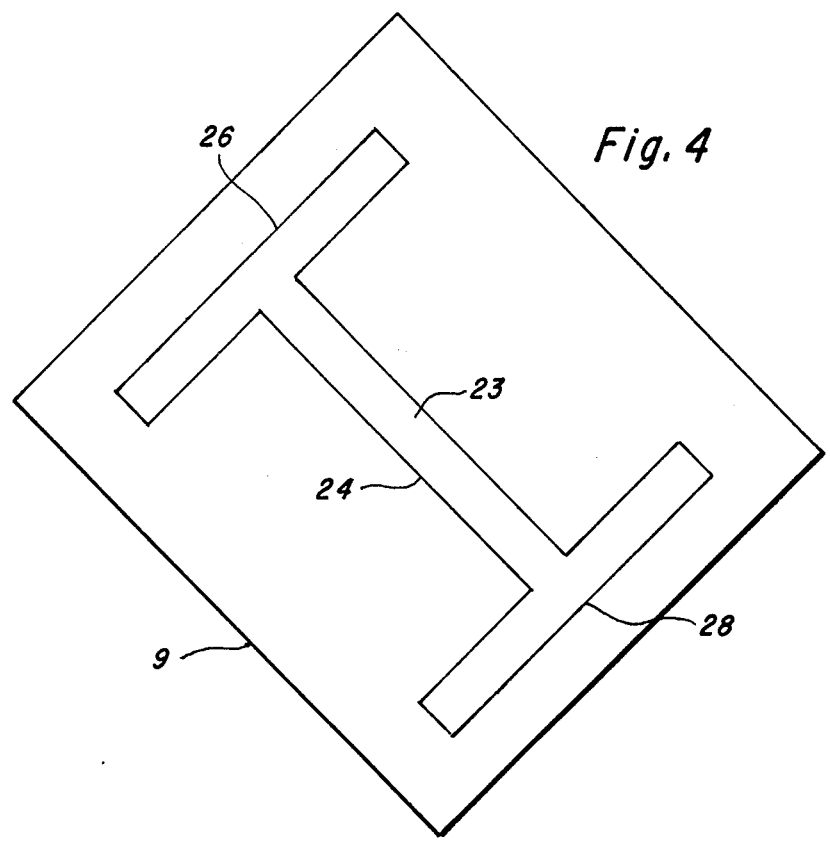
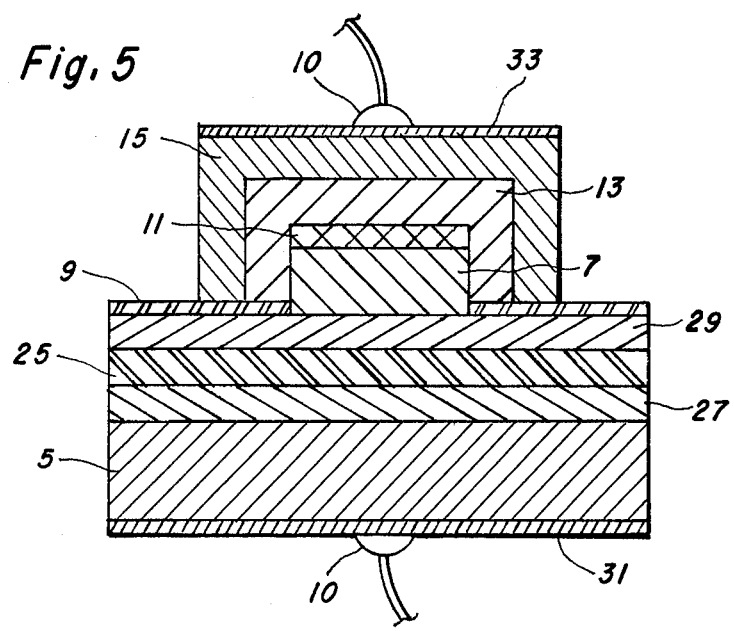

SEMICONDUCTOR LASER

This application is related to Application Ser. No. 784,399, filed April 4, 1977, which is a continuation of Application Ser. No. 645,776, filed December 31, 1975, now abandoned. This application is a division of Application Ser. No. 645,773 filed December 31, 1975, now abandoned.

This invention is directed to a semiconductor laser and more particularly to a new and improved semiconductor laser which is monolithic and can be fabricated in an integrated optical circuit.

Semiconductor lasers as such are known and have many present applications. There are two main types of semiconductor lasers. The first is a semiconductor laser which has a Fabry-Perot optical cavity. The second is a distributed feedback laser. Lasers utilizing Fabry-Perot cavities can be fabricated by four techniques. The first is a cleaved device which is formed in a crystal by cleaving along crystallographic directions. Such a semiconductor laser is primarily a discrete device and not easily integrable into an integrated optical circuit. The Fabry-Perot cavity semiconductor laser can also be formed by chemical etching. Such a semiconductor laser is monolithic, but the optical faces of such a device are normally neither flat nor parallel. Such semiconductor lasers are not practical for batch processing due to the control of depth of etch necessary to successfully fabricate such lasers. The efficiencies of such a chemically etched laser are lower by a factor of four compared to those of cleaved laser devices. Another semiconductor laser is formed by ion milling. Such a semiconductor laser has the same drawbacks and disadvantages as those lasers formed by chemical etching. A fourth semiconductor laser which has been successfully built and has many advantages is a laser in which grown optical facets form the laser cavity. This laser is grown by vapor phase epitaxy. Such a laser is monolithic and thus may be successfully fabricated into an integrated circuit. However, due to the material limitations of the growth techniques normally used in vapor phase epitaxy, such a laser cavity needs to be grown on (110) substrates. This is the wrong orientation for present integrated optical device components. In addition, such a laser cavity cannot be grown on all III-V materials. The present capabilities of such laser cavities are also limited to homojunction lasers. As it is well known in the art, the room temperature lasing threshold of homojunction lasers is too high for practical applications.

The distributed feedback lasers have many advantages such as the fact that they are monolithic and thus can be used in integrated circuits. The resonance feedback is from gratings and not from facets, so there is not the problem of growing or fabricating the facets by the techniques described for the optical laser cavity formed by mirrors. The distributed feedback lasers in addition can be grown by liquid phase epitaxy, and thus all III-V materials are available. Double heterostructure lasers have been grown and fabricated as distributed feedback lasers.

It is commonly known in the semiconductor laser technology that three classes of semiconductor lasers are presently available. First is the homojunction laser, which basically consists of a *p-n* junction in a single material such as gallium arsenide. As it has been pointed out, the drawback in such a semiconductor laser is that it can only usefully be operated at a very low temperature and can operate at room temperature only for extremely high threshold current. In addition, it can only be operated in a pulse mode and not a continuous mode. The second class is a single heterostructure laser. Such a semiconductor laser operates at room temperature; however, it does not operate at a continuous mode but operates in a pulse mode. Such a structure is grown by liquid epitaxy techniques. The structure consists of a *p-n* junction and a metallurgical junction which is normally gallium aluminum arsenide on a gallium arsenide substrate.

The most promising semiconductor structure is what is normally known as a double heterostructure. It can operate at room temperature and in a continuous output mode. This structure consists of a thin, active layer, such as gallium arsenide, surrounded by two different materials of lower index of refraction such as gallium aluminum arsenide. This is grown on a gallium arsenide substrate. For contacting purposes, a gallium arsenide cap is laid on top of the gallium aluminum arsenide.

Heretofore, the double heterostructure semiconductor lasers have generally been fabricated by the processes that have previously been described as cleaving, chemical etching, and ion milling to form the Fabry-Perot optical cavity. Such processes for fabricating the optical cavity make the semiconductor lasers with the Fabry-Perot optical cavity impractical for use in integrated optical circuits. Heterojunction structures have also been used in distributed feedback lasers. However, such a double heterojunction structure utilizing grown optical facets cannot be grown by vapor phase epitaxy.

It is therefore an object of this invention to provide a new and improved semiconductor laser. Another object of this invention is to provide a new and improved semiconductor laser which may be formed with all III-V materials and alloys in the III-V system. It is another object of this invention to particularly provide a new and improved semiconductor laser which may be formed in an integrated circuit. Another object of this invention is to provide a semiconductor laser for monolithic lasers with the capability of continuous mode of operation at room temperature.

In the drawings, FIG. 1 shows a cross-section of a semiconductor laser fabricated according to this invention.

FIG. 2 shows a top view of the mesa of the semiconductor laser fabricated according to this invention.

FIG. 3 shows a top view of a cross-section through the active layer in the laser.

FIG. 4 shows the mask pattern for the semiconductor laser.

FIG. 5 shows a cross-section of a semiconductor laser fabricated according to this invention and grown on a waveguide structure.

Referring first to FIG. 1, an embedded double heterostructure laser configuration is shown constructed according to this invention. An *n*-type gallium aluminum arsenide mesa 7 is shown grown on the *n*-type gallium arsenide substrate 5. A dielectric mask 9 is used to define the area on the substrate 5 where the gallium aluminum arsenide mesa 7 is grown. An active layer of *p*-type gallium arsenide, layer 11, is deposited on the *n*-type gallium aluminum arsenide mesa 7. A *p*-type gallium aluminum arsenide layer 13 is deposited over the *p*-type gallium arsenide active layer 11 in a manner such that it surrounds, in addition to the *p*-type active region gallium arsenide layer 11, the *n*-type gallium aluminum arsenide layer 7. Then to complete the structure, a p-type gallium arsenide layer 15 is deposited over the p-type gallium arsenide layer 13.

The n-type gallium arsenide substrate is a (100) oriented substrate. The deposition of the layers 7, 11, 13 and 15 is by a selective liquid phase epitaxy (in a manner to be described in more detail later).

FIG. 2 shows the top view of the grown mesa, a cross-section of which is shown in FIG. 1. The cross-section is taken along a line AB through central lasing cavity of the semiconductor laser. The semiconductor laser as fabricated has the I-bar type shape as shown in FIG. 2. The four layers deposited on the gallium arsenide substrate 5 shown in cross-section in FIG. 1, after construction, have the structure shown in FIG. 2. The facets of the semiconductor laser as grown by a liquid phase epitaxy on a (100) gallium arsenide substrate are such that the facets 17 are all (100) facets perpendicular to the substrate 5. The facets 19 as shown are (111) facets which are non-perpendicular to the substrate 5. The top facet 18 of the semiconductor mesa laser shown is also a (100) facet parallel to the substrate. The structure of the semiconductor laser shown in FIG. 2 is the total mesa laser of which a cross-section is shown in FIG. 1. Each deposited layer of the cross-section including the gallium aluminum arsenide layer 7, the gallium arsenide 11, the gallium aluminum arsenide layer 13, and the gallium arsenide 15 have the same facet structure as shown in FIG. 2. In addition, the bottom facet of each deposited layer will also have a (100) facet parallel to the substrate.

Referring now to FIG. 3 for a top cutaway view through the gallium arsenide active layer 11 in FIG. 1, the structure as shown is formed in the I-shaped form as shown in FIG. 2. The active gallium arsenide layer 11 is surrounded by the gallium aluminum arsenide layer 13 which is in turn surrounded by the gallium arsenide layer 15. The gallium aluminum arsenide layer 7 is underneath the gallium arsenide active layer 11 so it is not shown in FIG. 3. The active gallium arsenide layer 11 has the same facets shown in FIG. 2 with a bottom and top (100) facet parallel to the substrate 5, vertical (100) facets 17 perpendicular to the gallium arsenide substrate 5, and (111) facets 19 which are not perpendicular to the gallium arsenide substrate 5. The gallium arsenide layer 11 is the active layer in the lasing cavity. The outer gallium arsenide layer 15 in line with the longitudinal axis of the active element gallium arsenide layer 11 forms the mirror surfaces for the lasing cavity. These are shown as the areas 21 and 22 in FIG. 3. As has been noted, the facets at this position of the outer layer gallium arsenide layer 15 are formed in the (100) plane so that they are perpendicular to the substrate 5 and parallel to each other. The mirror surfaces 21 and 22 must be parallel to perform the lasing function. The lasing occurs in the active region 11 between the mirrors 21 and 22 in the longitudinal direction. This active region 11 as has been noted is bounded by the gallium aluminum arsenide layers 7 and 13 for optical and carrier confinement.

Referring now to FIG. 4, this figure shows the shape of the window in the dielectric mask 9 shown in FIG. 1. The window of the dielectric mask 9 defines an I-shaped pattern with all of the walls of the window 23 oriented in a (100) direction so all of the walls are parallel to the (100) planes. The fabrication is then carried out in a liquid epitaxy process. The gallium arsenide substrate 5 is used with the semiconductor laser fabricated on it in a manner to be described in FIGS. 1, 2, and 3. First, a layer of dielectric material is coated completely over the substrate 5 to a thickness on the order of 2,000 angstroms. The dielectric material could be silicon oxide, silicon nitride, aluminum oxide, and the like. The pattern shown in FIG. 4 is defined photolithographically. The pattern is in the general I-bar form such as that shown in FIG. 4. The I-bar window is formed from a longitudinal member 24 with cross bars 26 and 28 perpendicular to and integral with the longitudinal member 24 and at each end of such longitudinal member 24. A typical length for the longitudinal member is in the order of 14–28 mils, with each cross bar 26 and 28 in the order of 3–6 mils. The width of the window 23 varies from 5 microns to 25 microns. Windows are opened in the dielectric layer according to the pattern defined by the photolithography. The window opening is done by wet chemical techniques or by plasma etching.

After the window has been opened according to the pattern shown in FIG. 4, then the liquid phase epitaxy process is initiated to fabricate the structure shown in FIGS. 1, 2, and 3. First, the n-type gallium aluminum arsenide layer 7 is grown to a specified thickness. A normal thickness is in the order of two to three microns. Then the active gallium arsenide layer is grown to a specified thickness such as one micron. Following that, the gallium aluminum arsenide layer 13 is grown to a thickness such as two microns, and it is followed by growing the gallium arsenide layer 15 thickness to about one micron. These dimensions are simply typical examples and can of course be modified and changed according to the preferred device characteristics and/or to improve laser performance. By fabricating the device using the pattern shown in FIG. 4 by liquid epitaxy, the semiconductor laser mesa is grown to come up with the structure such as that shown in FIGS. 1, 2, and 3. The facets are as shown with the face at each longitudinal end of the mesa having the vertical (100) facets perpendicular to the plane of the gallium arsenide substrate. At each end of the cross bars of the I-bar the facets 19 are (111) facets. However, since the lasing occurs between the mirror facets 21 and 22, the (111) facets do not interfere with the lasing of the semiconductor laser.

The length of each cross bar 26 and 28 must be such that when the laser structure is grown the (111) facets are removed from the longitudinal axis 24 of the laser structure and there are vertical (100) facets at end of the longitudinal axis of the laser structure.

A semiconductor laser has been fabricated according to the invention disclosed and described heretofore. It lases at room temperature. The output wavelength is 8900 angstroms. The threshold current is 1.3 amperes, the threshold current density is 13 kiloamperes per square centimeter. The external differential quantum efficiency is 13 percent.

The semiconductor laser has been described with reference to a specific III-V compound and III-V alloys. The specific III-V compound used was gallium arsenide while the specific III-V alloy was gallium aluminum arsenide. Other III-V materials could be used where III is Al, Ga, or In and V is P, As, or Sb. The lasing cavity may be an alloy as well as a compound.

Such materials can be described as belonging to the general families III-V (e.g. GaAs, InAs, GaP, etc.), III-III'-V (e.g. $Ga_{l-x}Al_xAs$, $In_{l-x}Al_xAs$, $Ga_{l-x}Al_xP$, etc.), III-V-V' (e.g. $GaAs_{l-x}P_x$, $GaAs_{l-x}Sb_x$, $InAs_{l-x}P_x$, etc.), III-III'-V-V' (e.g. $Ga_{l-x}In_xAs_{l-y}P_y$, $Ga_{l-x}Al_xAs_{l-y}P_y$, $Ga_{l-}$ $_x$In$_x$As$_{l-y}$Sb$_y$, etc.), III-III'-III''-V (e.g. Ga$_{l-x-y}$In$_x$Al$_y$As, Ga$_{l-x-y}$In$_x$Al$_y$P) III-V-V'-V''' (e.g. GaAs$_{l-x-y}$P$_x$Sb$_y$, InAs$_{l-x-y}$P$_x$Sb$_y$) III-III'-III''-V-V' (e.g. Ga$_{l-x-y}$In$_x$Al$_y$As$_{l-z}$P$_z$, Ga$_{l-x-y}$In$_x$Al$_y$ As$_{l-z}$Sb$_z$, etc.) III-III'-V-V'-V'' (e.g. Ga$_{l-x}$Al$_x$As$_{l-y-z}$P$_y$Sb$_z$, Ga$_{l-x}$In$_x$As$_{l-y-z}$P$_y$Sb$_z$ etc.) III-III'-III''-V-V'-V'' (e.g. Ga$_{l-x-y}$In$_x$Al$_y$As$_{l-z-m}$P$_z$Sb$_m$).

In the double heterostructure configuration, the index of reflection of the layers on either side of the active laser layer must be lower than the index of refraction in the active layer.

The specific mesa laser shown shows a specific n-p-type relationship. This can obviously be reversed as desired.

FIG. 5 shows the cross-section of a mesa semiconductor laser constructed according to this invention grown on a waveguide structure. Such a waveguide structure is shown in issued U.S. Pat. No. 3,902,133 assigned to Texas Instruments Incorporated. The actual waveguide is gallium aluminum arsenide layer 25 with two gallium aluminum arsenide layers 27 and 29 on each side of the waveguide layer 25. These two layers 27 and 29 are used for optical confinement of the signal transferred through waveguide 25. The coupling between the laser and the waveguide is by evanescent field coupling such as that in a manner described in the patent. Contacts 10 are wires which are gold bonded to a metal layer 31 and 33 which are plated or evaporated on to the gallium arsenide surfaces.

It is also possible to have another type of waveguide in which layer 29 is omitted.

The index of refraction of layer 25 must be higher than layers 27 and 29 in a manner described in the patent.

The semiconductor laser embodiment described and shown in the drawings is a double heterostructure. A homojunction laser or a single heterostructure laser may be fabricated according to the teachings of this invention.

What is claimed is:

1. A semiconductor I-bar mesa laser on a semiconductor substrate comprising:
    an elongated central member having a longitudinal axis;
    a cross-bar integral with each end of said central member and perpendicular to said longitudinal axis; and
    oppositely spaced facets at each end of said central member, said facets being parallel to one another and perpendicular to said substrate, whereby said facets form reflecting mirrors of a longitudinal lasing cavity of said central member.

2. A laser as set forth in claim 1 wherein said mesa further comprises:
    a first layer of gallium aluminum arsenide;
    a second layer of gallium arsenide on top of said first layer; and
    a third layer of gallium aluminum arsenide surrounding said first and second layers.

3. A laser as set forth in claim 2 further including a fourth layer of gallium arsenide aurrounding said third layer.

4. A laser as set forth in claim 1 further including a semiconductor optical waveguide optically coupled with said laser.

5. A Group III-V semiconductor I-bar mesa laser on a Group III-V semiconductor substrate having a (100) orientation comprising:
    an elongated central member having a longitudinal axis of (100) orientation;
    a cross bar integral with each end of said central member and perpendicular to said longitudinal axis, said cross bars having end (111) crystallographic facets removed from said (100) longitudinal axis; and
    oppositely spaced (100) crystallographic facets at each end of said central member, said (100) crystallographic facets being parallel to one another and perpendicular to the plane of said substrate, whereby said facets form the reflecting mirrors of a longitudinal lasing cavity of said central member.

6. A laser as set forth in claim 5 wherein said mesa further comprises:
    a first layer of gallium aluminum arsenide having a top parallel to said substrate;
    a second layer of gallium arsenide on top of said first layer, said second layer having a top parallel to said substrate, said second layer comprising an active layer of said longitudinal lasing cavity;
    a third layer of gallium aluminum arsenide surrounding said first and second layers, said third layer having a top parallel to said substrate.

7. A laser as set forth in claim 6 further including a fourth layer of gallium arsenide surrounding said third layer whereby said fourth layer is means for contacting said laser.

8. A laser as set forth in claim 5 further including a semiconductor optical waveguide optically coupled with said laser for signal transfer therethrough.

* * * * *